(12) United States Patent
Yu

(10) Patent No.: US 6,268,253 B1
(45) Date of Patent: Jul. 31, 2001

(54) FORMING A REMOVABLE SPACER OF UNIFORM WIDTH ON SIDEWALLS OF A GATE OF A FIELD EFFECT TRANSISTOR DURING A DIFFERENTIAL RAPID THERMAL ANNEAL PROCESS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/418,407

(22) Filed: Oct. 14, 1999

(51) Int. Cl.[7] .................................................. H01L 21/336
(52) U.S. Cl. ........................ 438/303; 438/287; 438/299; 438/301; 438/305; 438/592; 438/595
(58) Field of Search ..................................... 438/287, 290, 438/299, 301, 303, 305, 306, 307, 529, 585, 591, 592, 594, 595

(56) References Cited

U.S. PATENT DOCUMENTS

| | | | |
|---|---|---|---|
| 4,716,131 | * 12/1987 | Okazawa et al. | 438/305 |
| 5,837,588 | * 11/1998 | Wu | 438/305 |
| 5,866,473 | * 2/1999 | Xiang et al. | 438/585 |
| 6,046,090 | * 4/2000 | Wu | 438/303 |
| 6,133,129 | * 10/2000 | Xiang et al. | 438/585 |

* cited by examiner

Primary Examiner—Charles Bowers
Assistant Examiner—Jack Chen
(74) Attorney, Agent, or Firm—Monica H. Choi

(57) ABSTRACT

A field effect transistor with scaled down dimensions is fabricated using a removable spacer having a substantially uniform width along the sidewalls of the gate of the field effect transistor during a differential RTA (Rapid Thermal Anneal) process. The removable spacer is formed on the sidewalls of the gate structure using the gate material on the sidewalls of the gate structure. Because the removable spacer has a width that is substantially uniform on the sidewalls of the gate of the MOSFET, the removable spacer may be readily etched using an dry etch process without adversely affecting other structures of the MOSFET. Exposed portions of the layer of gate dielectric are etched to form exposed portions of the active device area. A first dopant is then implanted into the exposed portions of the active device area to form a drain contact junction and a source contact junction of the field effect transistor. The first dopant is activated in the drain contact junction and the source contact junction using a first RTA (Rapid Thermal Anneal) process at a first temperature. The removable spacer is then etched from the sidewalls of the gate structure to form exposed extension implant areas in the active device area. A second dopant is then implanted into the exposed extension implant areas to form a drain extension implant and a source extension implant. The second dopant is then activated in the drain extension implant and the source extension implant using a second RTA (Rapid Thermal Anneal) process at a second temperature that is relatively lower than the first temperature of the first RTA process to preserve the shallow depth of the drain and source extension implants.

15 Claims, 3 Drawing Sheets

US 6,268,253 B1

FORMING A REMOVABLE SPACER OF UNIFORM WIDTH ON SIDEWALLS OF A GATE OF A FIELD EFFECT TRANSISTOR DURING A DIFFERENTIAL RAPID THERMAL ANNEAL PROCESS

TECHNICAL FIELD

The present invention relates generally to fabrication of field effect transistors, and more particularly, to a method for fabricating a field effect transistor by forming a removable spacer of substantially uniform width on the sidewalls of the gate such that a differential RTA (Rapid Thermal Anneal) process may effectively be used for activating dopants within drain and source extension implants of the field effect transistor with scaled down dimensions.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension implant 104 and a source extension implant 106 formed within an active device area 126 of the semiconductor substrate 102. The drain extension implant 104 and the source extension implant 106 are shallow junction implants to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which is typically a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define an active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

Referring to FIG. 1, dopants implanted into the drain contact junction 108 and the source contact junction 112, which are deeper junctions, and the gate structure 118 are activated typically using a RTA (Rapid Thermal Anneal) process at a relatively higher temperature such as at temperatures greater than 1000° Celsius, for example, as known to one of ordinary skill in the art of integrated circuit fabrication. Such higher temperature activation in the deeper drain and source contact junctions 108 and 112 reduces silicide to contact junction resistance. In addition, such higher temperature activation in the gate structure 118 reduces poly-depletion effect within the gate structure 118 such that the speed performance of the MOSFET 100 is enhanced, as known to one of ordinary skill in the art of integrated circuit fabrication.

In contrast, the drain extension implant 104 and the source extension implant 106 are designed to be shallow junctions to minimize short-channel effects within the MOSFET 100, as known to one of ordinary skill in the art of integrated circuit fabrication. Thus, dopants within the drain extension implant 104 and the source extension implant 106 are activated typically using a RTA (Rapid Thermal Anneal) process at a relatively lower temperature such as at temperatures less than 1000° Celsius, for example, as known to one of ordinary skill in the art of integrated circuit fabrication.

A fabrication process which uses such two separate RTA processes at two different temperatures is also known as a differential RTA (Rapid Thermal Anneal) process. During such a differential RTA process, activation of dopant with the RTA process using a relatively higher temperature is performed before activation of dopant with the RTA process using the relatively lower temperate. Thus, referring to FIG. 1, activation of dopant within the drain contact junction 108, the source contact junction 112, and the gate structure 118 with the RTA process using a relatively higher temperature is performed before activation of dopant within the drain extension implant 104 and the source extension implant 106 with the RTA process using a relatively lower temperature.

Referring to FIG. 1, during implantation of dopant into the drain contact junction 108, the source contact junction 112, and the gate structure 118, the spacer on the sidewalls of the gate structure 118 may be used for blocking the implantation of such dopant from the extension implant areas. Such a spacer is also known as a disposable spacer, as known to one of ordinary skill in the art of integrated circuit fabrication.

Referring to FIGS. 1 and 2, a conventional spacer 122 is comprised of silicon nitride (SiN). When such a spacer 122 including silicon nitride (SiN) is used on the sidewalls of the gate structure 118, the spacer liner oxide 124 is deposited as a buffer layer between the spacer 122 and the sidewalls of the polysilicon gate 118. Referring to FIG. 2, after the spacer 122 is used to block implantation of dopant from the extension implant areas 128, the spacer 122 is removed for implantation of dopant in the extension implant areas 128 for forming the drain extension implant 104 and the source extension implant 106. (Elements having the same reference number in FIGS. 1 and 2 refer to elements having similar structure and function.)

After the silicon nitride (SiN) spacer 122 is removed, the thin spacer liner oxide 124 remains. Because the spacer liner oxide 124 is relatively thin (typically in the range of 100 Å (angstroms) to 200 Å (angstroms) for example), the spacer liner oxide 124 may be difficult to etch off without adversely affecting the gate structure 118 which also has a small width of submicron or nanometer dimensions. However, implantation of dopant for forming the drain extension implant 104 and the source extension implant 106 while the thin spacer liner oxide 124 remains on the sidewalls of the gate structure 118 may result in insufficient overlap of the gate structure 118 over the drain extension implant 104 and the source extension implant 106. Such insufficient overlap results in large series resistance at the drain and the source of the MOSFET 100.

Referring to FIG. 3, a conventional silicon dioxide spacer 130 may be used for blocking implantation of dopant from the extension implant areas 128. Such a conventional silicon dioxide spacer 130 is formed by deposition of a layer of silicon dioxide over the whole surface of the semiconductor substrate 102 and then by patterning and etching the layer of silicon dioxide such that the silicon dioxide spacer 130 remains on the sidewalls of the gate structure 118. (Elements having the same reference number in FIGS. 1, 2, and 3 refer to elements having similar structure and function.)

However, with such formation of the conventional silicon dioxide spacer 130 of the prior art, a substantially triangular shape of the silicon dioxide spacer 130 results as illustrated in FIG. 3. Thus, the silicon dioxide spacer 130 has a substantially thinner width at the top away from the semiconductor substrate 102 and a thicker width at the bottom near the semiconductor substrate 102.

Referring to FIG. 3, after the spacer 130 is used to block implantation of dopant from the extension implant areas 128, the spacer 130 is removed for implantation of dopant in the extension implant areas 128 for forming the drain extension implant 104 and the source extension implant 106. However, with the substantially triangular shape of the silicon dioxide spacer 130 of the prior art, the top of the silicon dioxide spacer 130 having the thinner width would be etched off more quickly than the bottom of the silicon dioxide spacer 130 having the thicker width when a dry etch process is used. Unfortunately, the top of the gate structure 118 having scaled down submicron or nanometer dimensions may be significantly etched since the top of the silicon dioxide spacer 130 having the smaller width may be overetched by the time the bottom of the silicon dioxide spacer 130 is sufficiently etched. On the other hand, if a wet etch were to be used for etching the conventional silicon dioxide spacer 130, then the thin gate dielectric 116 which typically is also comprised of silicon dioxide may undesirably be etched.

Because of these disadvantages of the spacers 122 and 130 of the prior art, an improved removable spacer is desired such that a differential RTA (Rapid Thermal Anneal) process may effectively be used for implantation and activation of dopant into the drain and source extension implants for scaled down MOSFETs having submicron or nanometer dimensions.

SUMMARY OF THE INVENTION

Accordingly, in a general aspect of the present invention, a removable spacer having a substantially uniform width along the sidewalls of the gate of a field effect transistor is formed during a differential RTA (Rapid Thermal Anneal) process.

In one embodiment of the present invention, for fabrication of a field effect transistor having scaled down dimensions using a differential RTA (Rapid Thermal Anneal) process, a layer of gate dielectric is first deposited on an active device area within a semiconductor substrate. A gate structure is formed on the layer of gate dielectric, and the gate structure is comprised of a gate material. A removable spacer is formed on the sidewalls of the gate structure using the gate material on the sidewalls of the gate structure. The removable spacer has a substantially uniform width along the sidewalls of the gate structure. Exposed portions of the layer of gate dielectric are etched to form exposed portions of the active device area. A first dopant is then implanted into the exposed portions of the active device area to form a drain contact junction and a source contact junction of the field effect transistor. The first dopant is activated in the drain contact junction and the source contact junction using a first RTA (Rapid Thermal Anneal) process at a first temperature.

The removable spacer is then etched from the sidewalls of the gate structure to form exposed extension implant areas in the active device area. A second dopant is then implanted into the exposed extension implant areas to form a drain extension implant and a source extension implant. The second dopant is then activated in the drain extension implant and the source extension implant using a second RTA (Rapid Thermal Anneal) process at a second temperature. The second temperature of the second RTA process is relatively lower than the first temperature of the first RTA process to preserve the shallow depth of the drain and source extension implants such that short-channel effects are prevented in the MOSFET of the present invention.

In this manner, a removable spacer that has a substantially uniform width along the sidewalls of the gate of the field effect transistor is formed to block implantation of dopant in the extension implant areas of the field effect transistor during dopant implantation for the deeper drain and source contact junctions. Because the removable spacer of the present invention has a width that is controllable and that is substantially uniform along the sidewalls of the gate of the field effect transistor, in contrast to the spacer of the prior art, the removable spacer of the present invention may be readily etched off the sidewalls of the gate of the field effect transistor without adversely affecting other structures of the MOSFET. With the removable spacer easily etched off the sidewalls of the gate of the field effect transistor, drain and source extension implants are effectively formed near the gate of the field effect transistor, such that the field effect transistor may further be scaled down.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
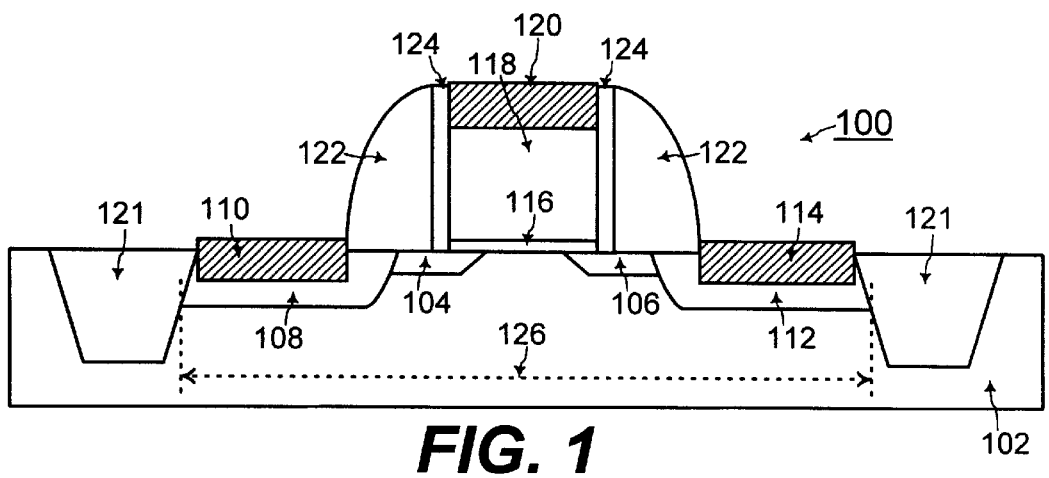
FIG. 1 shows a cross-sectional view of a MOSFET (Metal Oxide Semiconductor Field Effect Transistor) having drain and source contact junctions and drain and source extension implants.
Figure 2:
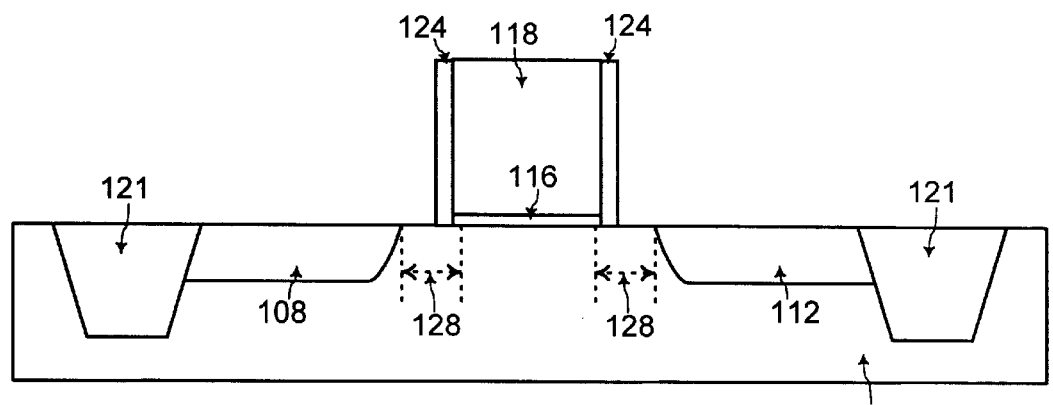
FIG. 2 shows a cross-sectional view of a MOSFET having a spacer liner oxide that remains on the sidewalls of a gate of the MOSFET after removal of a spacer comprised of silicon nitride (SiN)
Figure 3:
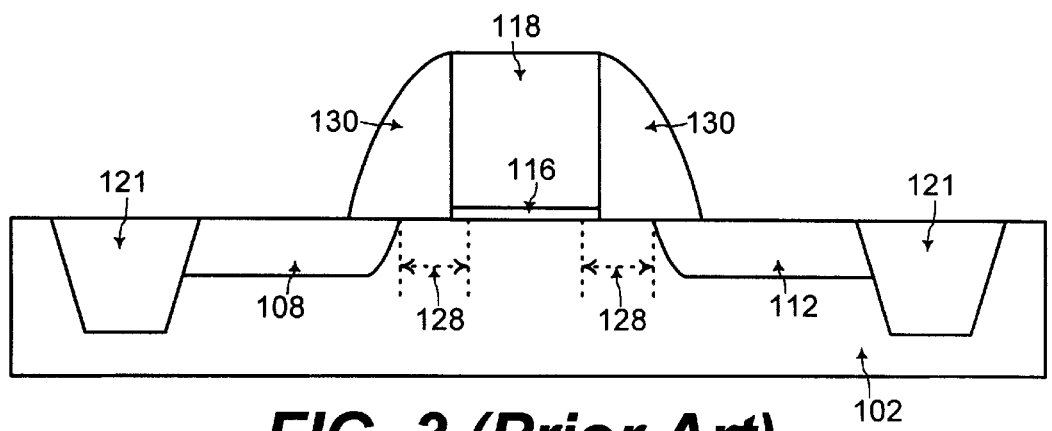
FIG. 3 shows a cross-sectional view of a MOSFET having a conventional silicon dioxide spacer with a substantially triangular shape.
Figure 4:
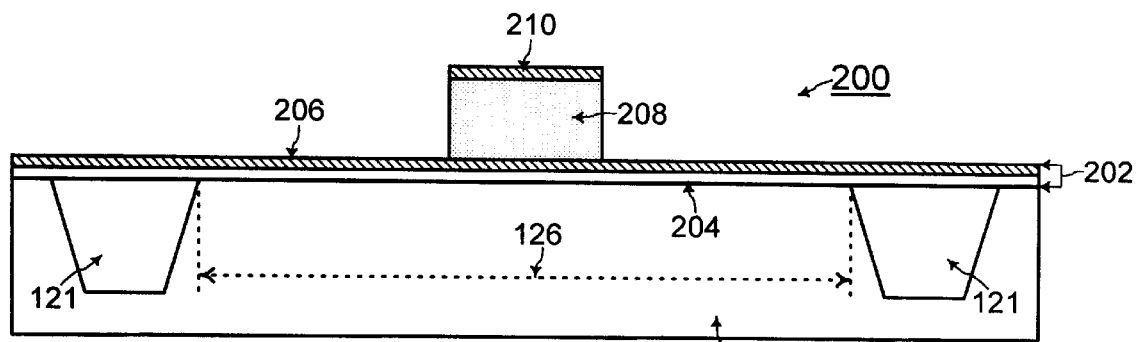
FIGS. 4, 5, 6, 7, 8, and 9 show cross-sectional views of a MOSFET fabricated according to the present invention for illustrating the steps for formation of drain and source extension implants using a removable spacer having a substantially uniform width on the sidewalls of the gate of the field effect transistor during a differential RTA (Rapid Thermal Anneal) process.

Referring to FIG. 4, for effective fabrication of a MOSFET (Metal Oxide Semiconductor Field Effect Transistor) 200 of the present invention using a removable spacer in a differential RTA (Rapid Thermal Anneal) process, a layer of gate dielectric 202 is deposited on the active device area 126 of the semiconductor substrate 102. The layer of gate dielectric 202 may be comprised for example of a gate stack of a layer of silicon dioxide ($SiO_2$) 204 (having a thickness in a range of 10 Å (angstroms) to 15 Å (angstroms) for example in one embodiment of the present invention) deposited onto the semiconductor substrate 102 and a layer of silicon nitride 206 (having a thickness of approximately 10 Å (angstroms) for example in one embodiment of the present invention) deposited onto the layer of silicon dioxide 204.

A gate structure 208 is then formed on the layer of gate dielectric 202. The gate structure 208 is comprised of a gate material which may be polysilicon for example. Fabrication processes for such deposition of the layer of gate dielectric 202 and such formation of the gate structure 208 are known to one of ordinary skill in the art of integrated circuit fabrication.

According to an aspect of the present invention, a gate capping layer 210 is also formed on the gate structure 208. The gate capping layer 210 is typically comprised of silicon nitride (SiN) and prevents the growth of material on the gate structure 208 during subsequent steps of the fabrication process of the present invention. The gate capping layer 210 may have a width in the range of 100 Å (angstroms) to 150 Å (angstroms) for example according to one embodiment of the present invention. Fabrication processes for formation of the gate capping layer 210 are known to one of ordinary skill in the art of integrated circuit fabrication.

Figure 5:
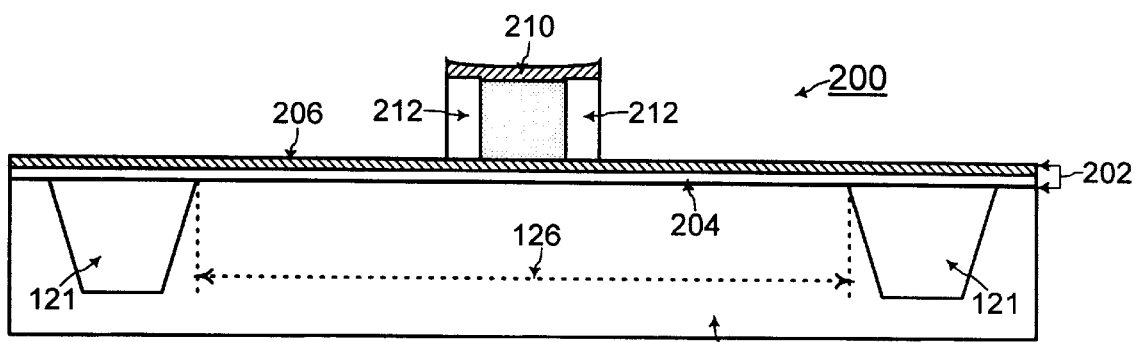

Referring to FIG. 5, a removable spacer 212 is formed on the sidewalls of the gate structure 208. The removable spacer 212 is formed by using the gate material of the gate structure 208. For example, when the gate structure 208 is comprised of polysilicon, the removable spacer 212 is formed by oxidation of the polysilicon of the gate structure 208 at an oxidation temperature in the range of approximately 850° Celsius to 900° Celsius for example according to one embodiment of the present invention. Such oxidation processes for formation of the removable spacer 212 are known to one of ordinary skill in the art of integrated circuit fabrication.

Referring to FIG. 5, because the removable spacer 212 is formed by oxidation of the sidewalls of the gate structure 208, the removable spacer 212 of the present invention has a controlled width and has a substantially uniform width along the sidewalls of the gate structure 208. The width of the removable spacer 212 may be in a range of 300 Å (angstroms) to 500 Å (angstroms) for example according to one embodiment of the present invention. The gate capping layer 210 which covers the top of the gate structure 208 prevents oxidation at the top of the gate structure 208.

Figure 6:
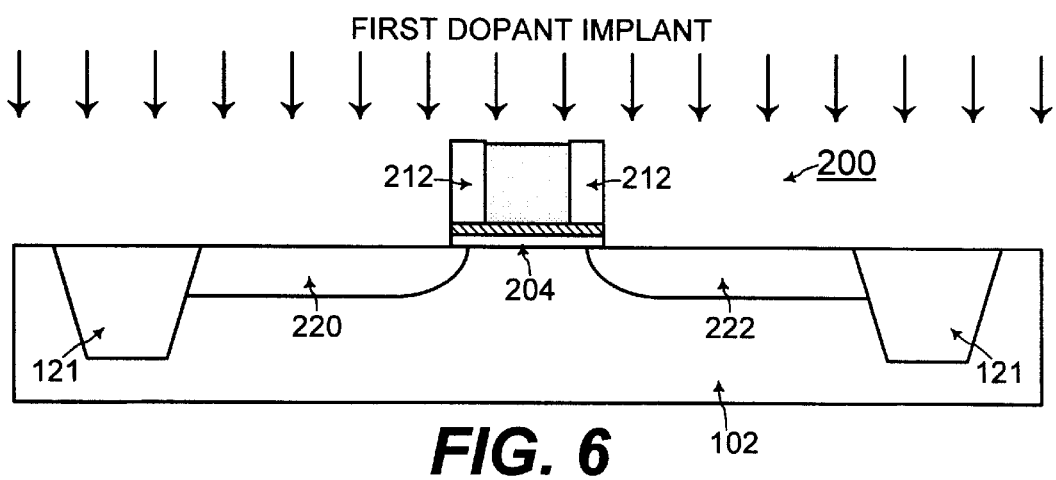

Referring to FIG. 6, exposed portions of the layer of gate dielectric 202 and the gate capping layer 210 are etched using a dry anisotropical plasma etch process. Such an etch process for removing the exposed portions of the layer of gate dielectric 202 and the gate capping layer 210 are known to one of ordinary skill in the art of integrated circuit fabrication.

Referring to FIG. 6, after the exposed portions of the layer of gate dielectric 202 is etched, a first dopant is implanted into exposed portions of the active device area 126 to form a drain contact junction 220 and a source contact junction 222 of the MOSFET 200 of the present invention. In addition, the first dopant is also implanted into the exposed gate structure 208. Silicide is later formed with the drain contact junction 220, the source contact junction 222, and the gate structure 208. Thus, this implantation of the first dopant into the drain contact junction 220, the source contact junction 222, and the gate structure 208 is a relatively deep implantation. Such an implantation process is known to one of ordinary skill in the art of integrated circuit fabrication.

The first dopant is an N-type dopant when the MOSFET 200 is an NMOSFET (N-channel Metal Oxide Semiconductor Field Effect Transistor). Alternatively, the first dopant is a P-type dopant when the MOSFET 200 is a PMOSFET (P-channel Metal Oxide Semiconductor Field Effect Transistor).

Further referring to FIG. 6, the first dopant within the drain contact junction 220, the source contact junction 222, and the gate structure 208 is activated using a first RTA (Rapid Thermal Anneal) process in the differential RTA (Rapid Thermal Anneal) process of the present invention. The first RTA process uses a relatively higher temperature in the range of approximately 1050° Celsius to 1100° Celsius for example according to one embodiment of the present invention. Such activation of the first dopant at the relatively higher temperature reduces the poly-depletion effect within the gate structure 208 to enhance the speed performance of the MOSFET 200 and reduces the silicide to junction resistance of the drain contact junction 220 and the source contact junction 222. Such higher temperature RTA processes are known to one of ordinary skill in the art of integrated circuit fabrication.

Figure 7:
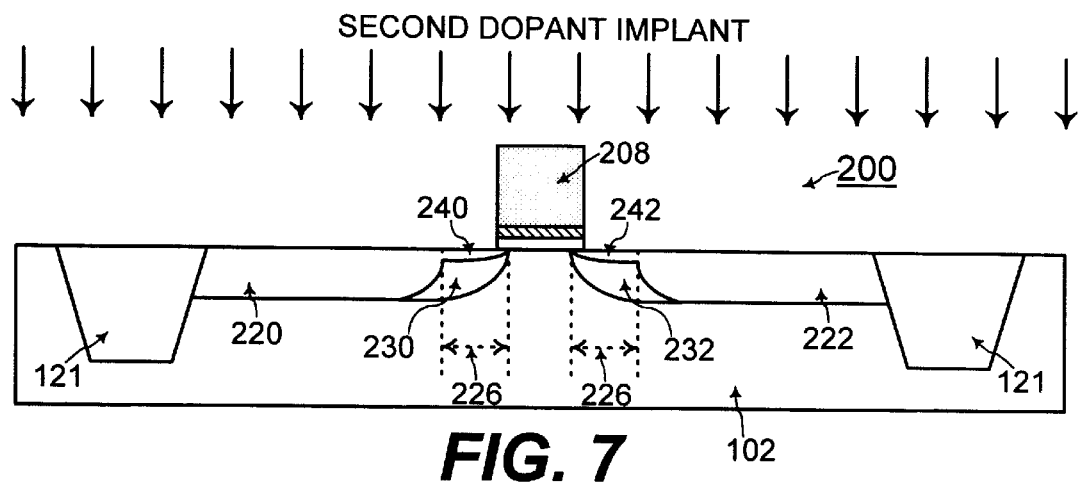

Referring to FIGS. 6 and 7, the removable spacer 212 is then etched from the sidewalls of the gate structure 208. In addition, the layer of gate dielectric 202 under the removable spacer 212 is also etched. The removable spacer 212 and the layer of gate dielectric 202 under the removable spacer 212 are etched using a dry anisotropical plasma etch process such that the thin layer of gate oxide 204 which remains under the gate structure 208 is not etched. Such etching processes are known to one of ordinary skill in the art of integrated circuit fabrication.

Further referring to FIG. 7, etching of the removable spacer 212 and the layer of gate dielectric 202 forms exposed implant areas 226 in the active device area 126. A drain pocket 230 and a source pocket 232 are formed in the exposed implant areas. Then, a second dopant is implanted into the exposed implant areas 226 of the active device area 126 to form a drain extension implant 240 and a source extension implant 242 of the MOSFET 200 of the present invention. For minimizing short-channel effects, the drain extension implant 240 and the source extension implant 242 are designed to be shallow implants. Such shallow implantation processes are known to one of ordinary skill in the art of integrated circuit fabrication.

The second dopant is an N-type dopant when the MOSFET 200 is an NMOSFET (N-channel Metal Oxide Semiconductor Field Effect Transistor). Alternatively, the first dopant is a P-type dopant when the MOSFET 200 is a PMOSFET (P-channel Metal Oxide Semiconductor Field Effect Transistor). The drain pocket 230 and the source pocket 232 minimize short-channel effects within the MOSFET 200 having scaled down submicron or nanometer dimensions, as known to one of ordinary skill in the art. For an NMOSFET, the drain pocket 230 and the source pocket 232 are doped with a P-type dopant. Alternatively, for a PMOSFET, the drain pocket 230 and the source pocket 232 are doped with an N-type dopant.

Further referring to FIG. 7, the second dopant within the drain extension implant 240 and the source extension implant 242 is activated using a second RTA (Rapid Thermal Anneal) process in the differential RTA (Rapid Thermal Anneal) process of the present invention. The second RTA process uses a relatively lower temperature in the range of approximately 850° Celsius to 950° Celsius for example according to one embodiment of the present invention. Such activation of the second dopant at the relatively lower temperature preserves the shallow depth of the drain extension implant 240 and the source extension implant 242 such that short-channel effects are prevented in the MOSFET 200 of the present invention. Such lower temperature RTA processes are known to one of ordinary skill in the art of integrated circuit fabrication.

Figure 8:
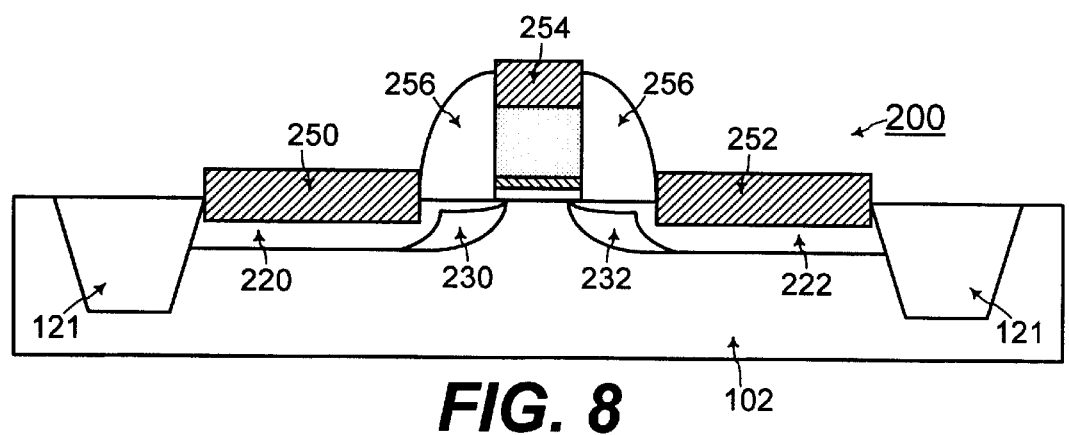

Referring to FIG. 8, a drain silicide 250 is formed with the drain contact junction 220 for providing contact to the drain of the MOSFET 200, and a source silicide 252 is formed with the source contact junction 222 for providing contact to the source of the MOSFET 200. A gate silicide 254 is formed with the gate structure 208 for providing contact to the gate of the MOSFET 200. Such silicides may be comprised of one of cobalt silicide ($CoSi_2$) or titanium silicide ($TiSi_2$) for example, and processes for formation of such silicides are known to one of ordinary skill in the art of integrated circuit fabrication. In addition, an isolation spacer 256 such as a conventional oxide spacer may be formed on the sidewalls of the gate structure 208.

Figure 9:
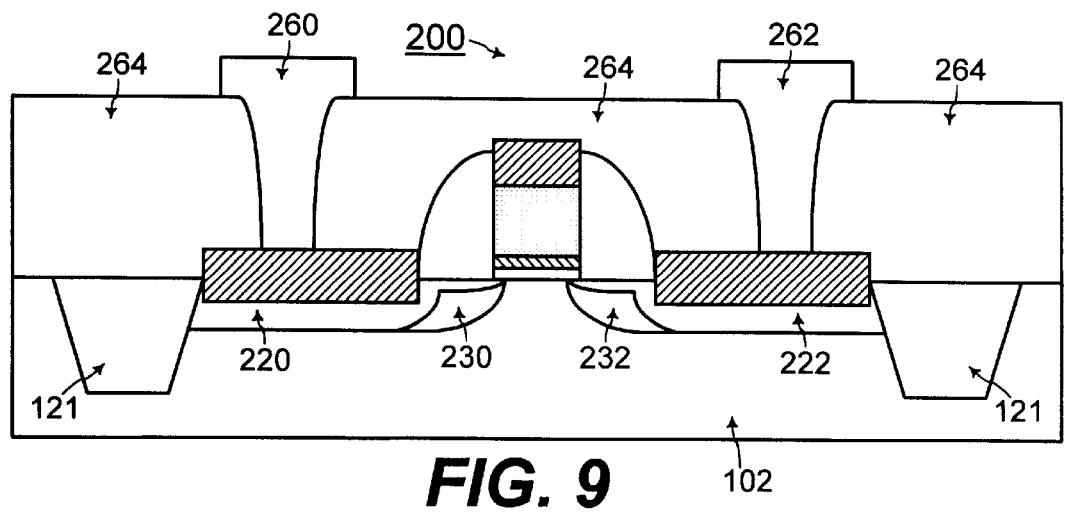

Referring to FIG. 9, conventional fabrication processes may follow for forming contacts and interconnects to the MOSFET 200 such as a drain contact 260 to provide connection to the drain silicide 250 and a source contact 262 to provide connection to the source silicide 252. Field oxides 264 may also be deposited for electrical isolation of the components of the MOSFET 200.

In this manner, a removable spacer is formed to have a controlled width that is substantially uniform on the sidewalls of the gate of the MOSFET during a differential RTA process of the present invention. Such a removable spacer blocks implantation of a first dopant from the extension implant areas during formation of the deeper drain and source contact junctions. The first dopant within the deeper drain and source contact junctions is activated using a first RTA (Rapid Thermal Anneal) process of a relatively higher temperature.

The removable spacer is then etched for forming the drain and source extension implants by shallow implantation of a second dopant. The second dopant within the drain and source extension implants is activated using a second RTA (Rapid Thermal Anneal) process of a relatively lower temperature to preserve the shallow depth of the drain and source extension implants. Because the removable spacer has a width that is substantially uniform on the sidewalls of the gate of the MOSFET, the removable spacer may be readily etched using an dry anisotropical plasma etch process without adversely affecting other structures of the MOSFET 200.

The foregoing is by way of example only and is not intended to be limiting. For example, any specified thickness of any structure described herein is by way of example only. Furthermore, as will be understood by those skilled in the art, the structures described herein may be made or used in the same way regardless of their position and orientation. Accordingly, it is to be understood that terms and phrases such as "top," "sidewall," and "under" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor having scaled down dimensions using a differential RTA (Rapid Thermal Anneal) process, the method including the sequential steps of:

A. depositing a layer of gate dielectric on an active device area within a semiconductor substrate;

B. forming a gate structure on said layer of gate dielectric, said gate structure being comprised of a gate material;

C. forming a removable spacer on sidewalls of said gate structure using said gate material on said sidewalls of said gate structure, said removable spacer having a uniform width along said sidewalls of said gate structure, wherein said removable spacer is formed by oxidation of said gate structure;

D. etching exposed portions of said layer of gate dielectric to form exposed portions of said active device area and to expose a top surface of said semiconductor substrate;

E. implanting a first dopant into said exposed portions of said active device area to form a drain contact junction and a source contact junction of said field effect transistor and into gate structure;

F. activating said first dopant in said drain contact junction and said source contact junction using a first RTA (Rapid Thermal Anneal) process at a first temperature;

G. etching said removable spacer on said sidewalls of said gate structure to form exposed extension implant areas in said active device area;

H. implanting a second dopant into said exposed extension implant areas to form a drain extension implant and a source extension implant; and I. activating said second dopant in said drain extension implant and said source extension implant using a second RTA (Rapid Thermal Anneal) process at a second temperature.

2. The method of claim 1, further including the step of:

forming a gate capping layer on top of said gate structure before said step C such that said removable spacer does not form on said top of said gate structure during said step C.

3. The method of claim 2, further including the steps of:

etching said gate capping layer from said top of said gate structure after said step C and before said step E;

implanting said first dopant into said gate structure during said step E; and activating said first dopant within said gate structure using said first RTA process at said first temperature in said step F.

4. The method of claim 3, wherein said gate material of said gate structure is polysilicon, and wherein said removable spacer is comprised of silicon dioxide ($SiO_2$) formed by oxidation of said polysilicon at said sidewalls of said gate structure, and wherein said gate capping layer is comprised of silicon nitride (SiN).

5. The method of claim 1, further including the steps of
forming a drain pocket, in said exposed extension implant areas before said step H, into which said drain extension implant is formed in said step H; and
forming a source pocket, in said exposed extension implant areas before said step H, into which said source extension implant is formed in said step H;
wherein said drain pocket and said source pocket minimize short-channel effects in said field effect transistor.

6. The method of claim 1, further including the steps of:
forming an isolation spacer on said sidewalls of said gate structure after said step I; and
forming silicide on said drain contact junction, said source contact junction, and said gate structure.

7. The method of claim 1, wherein said gate material of said gate structure is polysilicon, and wherein said removable spacer is comprised of silicon dioxide ($SiO_2$) formed by oxidation of said polysilicon at said sidewalls of said gate structure.

8. The method of claim 1, wherein said semiconductor substrate is comprised of silicon, and wherein said layer of gate dielectric is comprised of a layer of silicon dioxide ($SiO_2$) and a layer of silicon nitride (SiN).

9. The method of claim 1, wherein said first temperature of said first RTA process is greater than said second temperature of said second RTA process.

10. The method of claim 9, wherein said first temperature of said first RTA process is in a range of approximately 1050° Celsius to 1100° Celsius.

11. The method of claim 9, wherein said second temperature of said second RTA process is in a range of approximately 850° Celsius to 950° Celsius.

12. The method of claim 1, wherein said field effect transistor is a MOSFET (Metal Oxide Semiconductor Field Effect Transistor).

13. The method of claim 12, wherein said first dopant and said second dopant are comprised of an N-type dopant for fabricating an NMOSFET (N-channel Metal Oxide Semiconductor Field Effect Transistor).

14. The method of claim 12, wherein said first dopant and said second dopant are comprised of a P-type dopant for fabricating a PMOSFET (P-channel Metal Oxide Semiconductor Field Effect Transistor).

15. A method for fabricating a MOSFET (Metal Oxide Semiconductor Field Effect Transistor) having scaled down dimensions using a differential RTA (Rapid Thermal Anneal) process, the method including the sequential steps of:

A. depositing a layer of gate dielectric on an active device area within a semiconductor substrate comprised of silicon, said layer of gate dielectric being comprised of a gate stack of silicon dioxide ($SiO_2$) and silicon nitride (SiN);

B. forming a gate structure on said layer of gate dielectric, said gate structure being comprised of polysilicon;

C. forming a gate capping layer of silicon nitride (SiN) on top of said gate structure;

D. forming a removable spacer of silicon dioxide ($SiO_2$) on sidewalls of said gate structure by oxidation of said polysilicon on said sidewalls of said gate structure, said removable spacer having a uniform width along said sidewalls of said gate structure;
and wherein said gate capping layer on said top of said gate structure prevents oxidation of said polysilicon on said top of said gate structure;

E. etching exposed portions of said layer of gate dielectric to form exposed portions of said active device area, and etching said gate capping layer from said top of said gate structure and to expose a top surface of said semiconductor substrate;

F. implanting a first dopant into said exposed portions of said active device area to form a drain contact junction and a source contact junction of said MOSFET, and implanting said first dopant into said gate structure, said first dopant being one of an N-type dopant for fabrication of an NMOSFET (N-channel Metal Oxide Semiconductor Field Effect Transistor) and of a P-type dopant for fabrication of a PMOSFET (P-channel Metal Oxide Semiconductor Field Effect Transistor);

G. activating said first dopant in said drain contact junction, said source contact junction, and said gate structure using a first RTA (Rapid Thermal Anneal) process at a first temperature in a range of approximately 1050° Celsius to 1100° Celsius;

H. etching said removable spacer on said sidewalls of said gate structure to form exposed extension implant areas in said active device area;

I. forming a drain pocket and a source pocket in said exposed extension implant areas;

J. implanting a second dopant into said drain pocket to form a drain extension implant and into said source pocket to form a source extension implant, said second dopant being one of an N-type dopant for fabrication of an NMOSFET (N-channel Metal Oxide Semiconductor Field Effect Transistor) and of a P-type dopant for fabrication of a PMOSFET (P-channel Metal Oxide Semiconductor Field Effect Transistor);
and wherein said drain pocket and said source pocket minimize short-channel effects in said MOSFET;

K. activating said second dopant in said drain extension implant and said source extension implant using a second RTA, Rapid Thermal Anneal) process at a second temperature in a range of approximately 850° Celsius to 950° Celsius;

L. forming an isolation spacer of silicon dioxide ($SiO_2$) on said sidewalls of said gate structure; and M. forming silicide on said drain contact junction, said source contact junction, and said gate structure.

* * * * *